(12) United States Patent
Nagano

(10) Patent No.: US 8,017,990 B2
(45) Date of Patent: Sep. 13, 2011

(54) NONVOLATILE SEMICONDUCTOR MEMORY DEVICE AND METHOD OF FABRICATING THE SAME

(75) Inventor: Hajime Nagano, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 111 days.

(21) Appl. No.: 12/497,955

(22) Filed: Jul. 6, 2009

(65) Prior Publication Data
US 2010/0072534 A1 Mar. 25, 2010

(30) Foreign Application Priority Data
Sep. 24, 2008 (JP) ................. 2008-244107

(51) Int. Cl.
*H01L 29/788* (2006.01)
(52) U.S. Cl. ............................ 257/316; 257/E29.129
(58) Field of Classification Search .......... None
See application file for complete search history.

(56) References Cited

U.S. PATENT DOCUMENTS

| | | | |
|---|---|---|---|
| 6,835,978 B2 | 12/2004 | Matsui et al. | |
| 2006/0060911 A1* | 3/2006 | Sakuma et al. | 257/315 |
| 2007/0001213 A1* | 1/2007 | Om et al. | 257/315 |
| 2007/0128802 A1* | 6/2007 | Aritome | 438/257 |
| 2007/0132007 A1* | 6/2007 | Kamigaichi et al. | 257/316 |
| 2007/0176224 A1* | 8/2007 | Yaegashi | 257/315 |
| 2008/0179654 A1 | 7/2008 | Sato et al. | |
| 2008/0185630 A1 | 8/2008 | Aoyama et al. | |
| 2009/0096007 A1 | 4/2009 | Omura et al. | |
| 2009/0140315 A1 | 6/2009 | Kuniya | |

FOREIGN PATENT DOCUMENTS

| | | |
|---|---|---|
| JP | 2002-176114 | 6/2002 |
| JP | 2007-207946 | 8/2007 |

* cited by examiner

*Primary Examiner* — Ha Tran T Nguyen
*Assistant Examiner* — Vongsavanh Sengdara
(74) *Attorney, Agent, or Firm* — Oblon, Spivak, McClelland, Maier & Neustadt, L.L.P.

(57) ABSTRACT

A nonvolatile semiconductor memory device includes a gate insulating film formed on a semiconductor substrate, a first gate electrode corresponding to a memory cell transistor and a second gate electrode. The first gate electrode includes a floating gate electrode film, a first interelectrode insulating film and a control gate electrode film. The floating gate electrode film has a polycrystalline silicon film and the control gate electrode film having a silicide film. The second gate electrode includes a lower electrode film, a second interelectrode insulating film and an upper electrode film. The second interelectrode insulating film includes an opening. The lower electrode film includes a void below the opening of the second interelectrode insulating film. The upper electrode film includes a silicide film. The lower electrode film includes a polycrystalline silicon film and a silicide film which is located between the opening and the void.

8 Claims, 18 Drawing Sheets

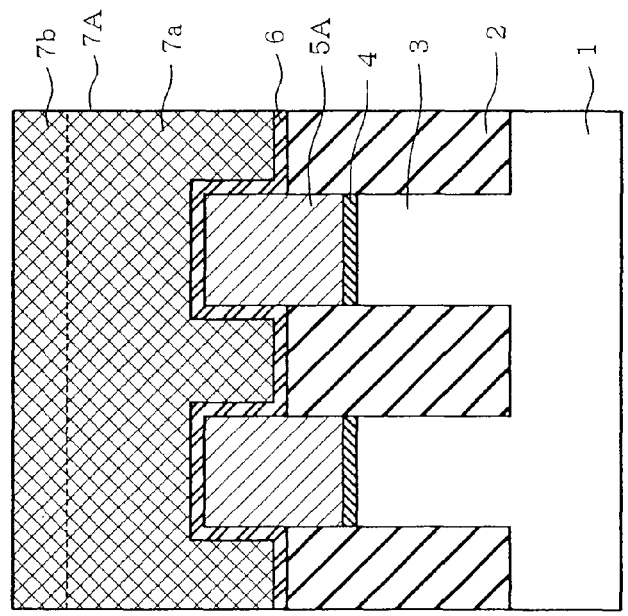
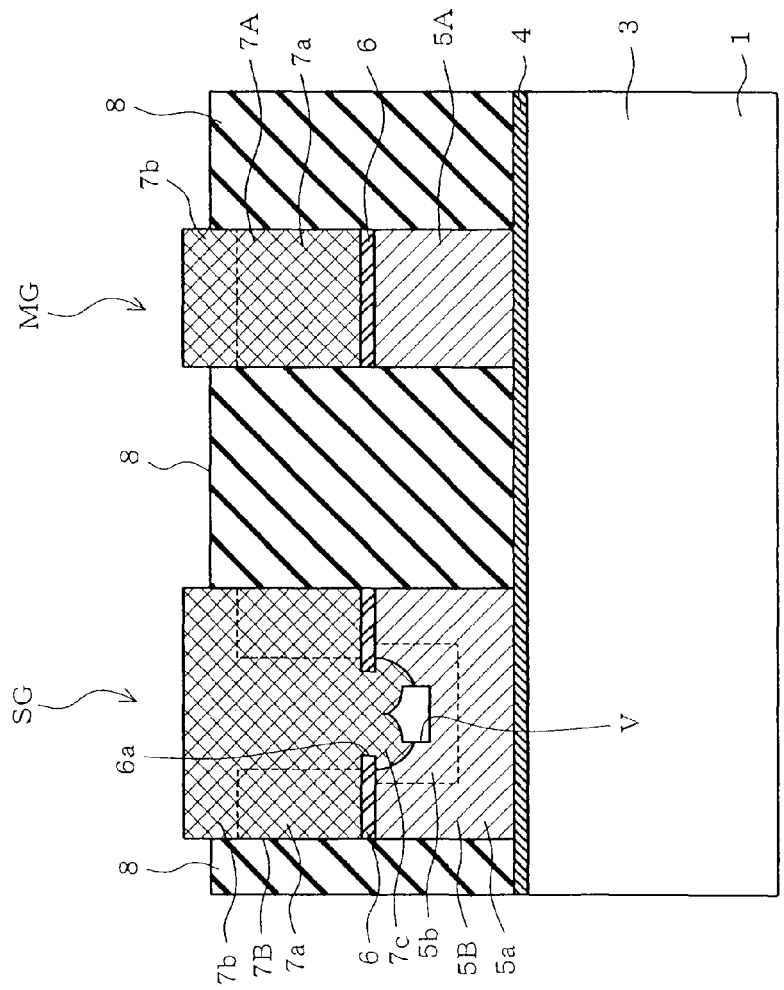
FIG. 3B
FIG. 3A

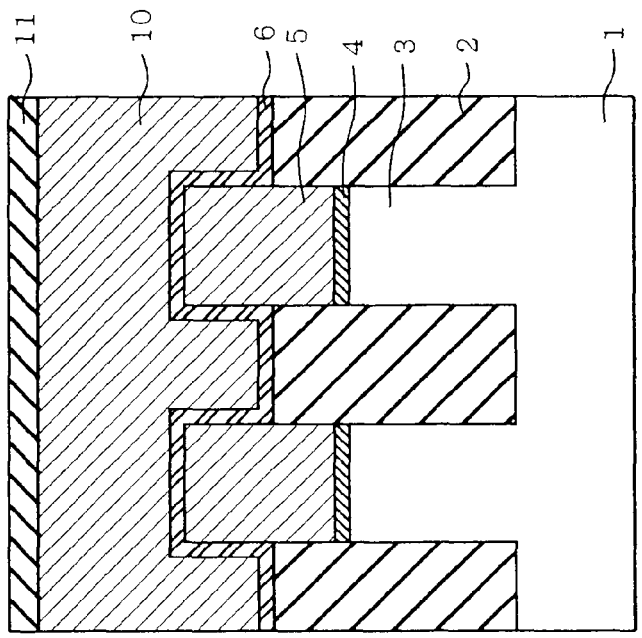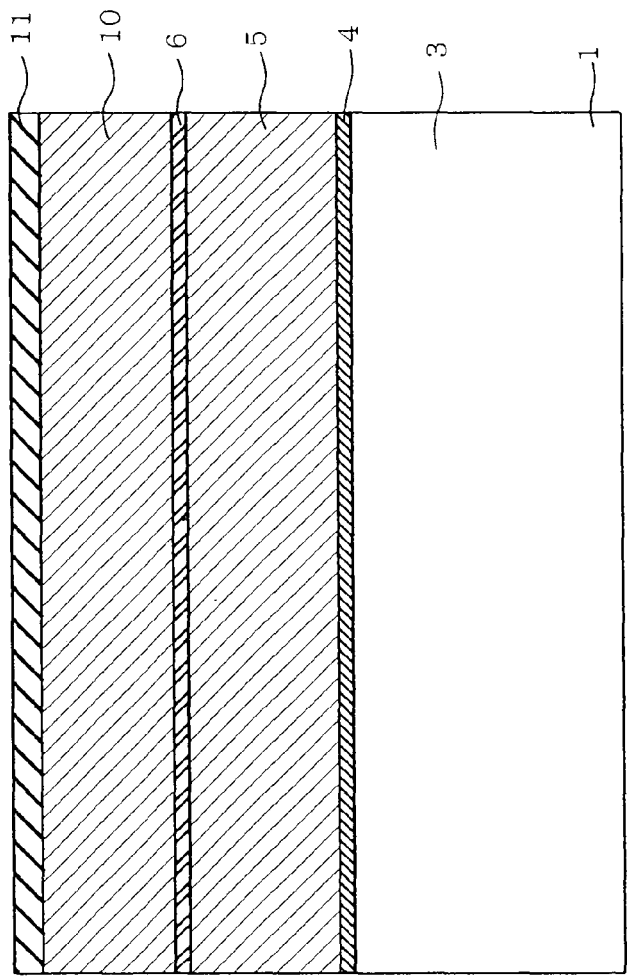

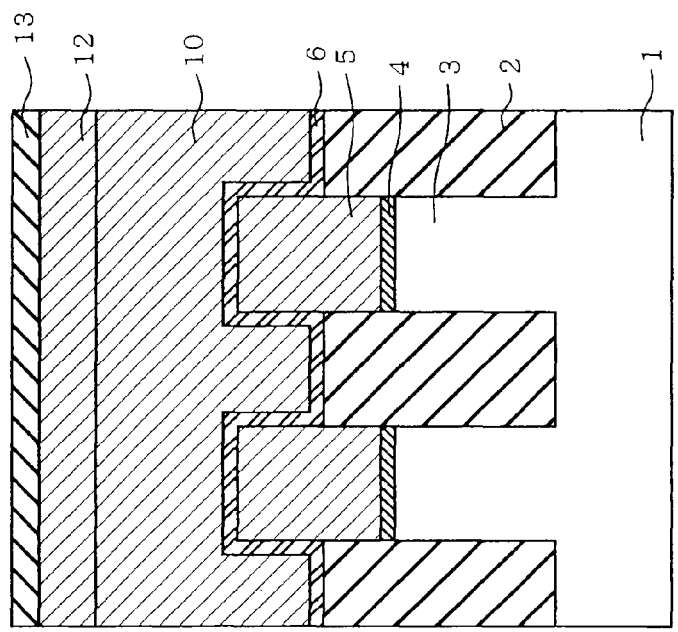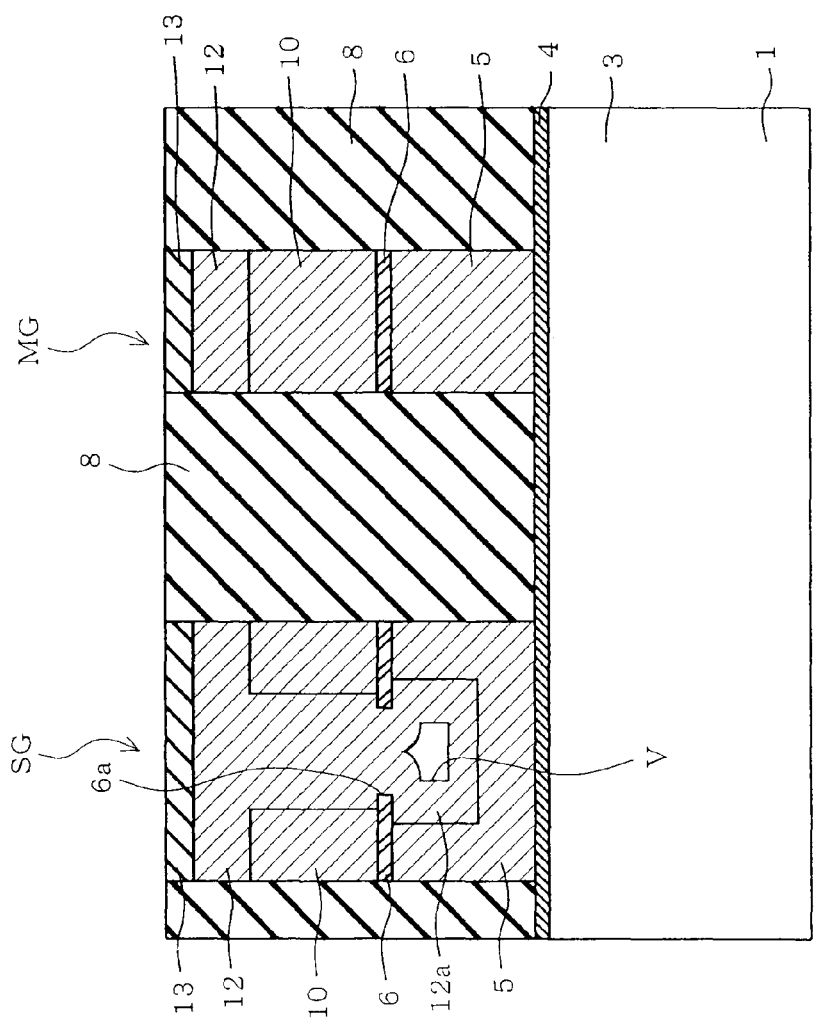
FIG. 15B
FIG. 15A

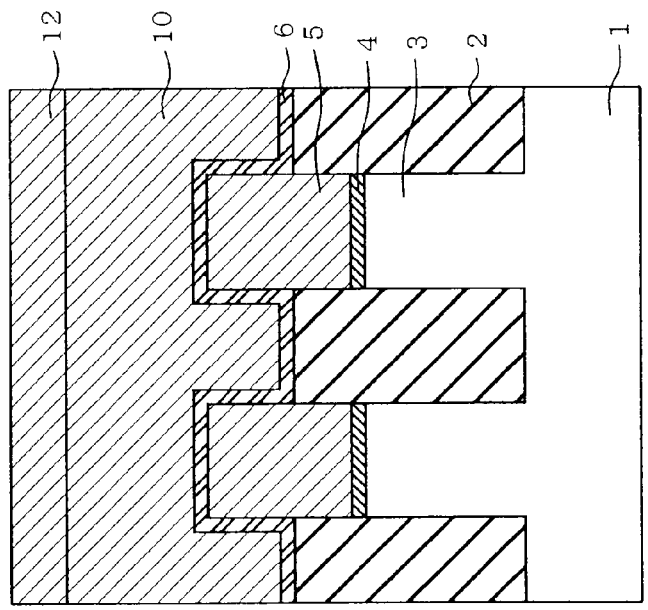
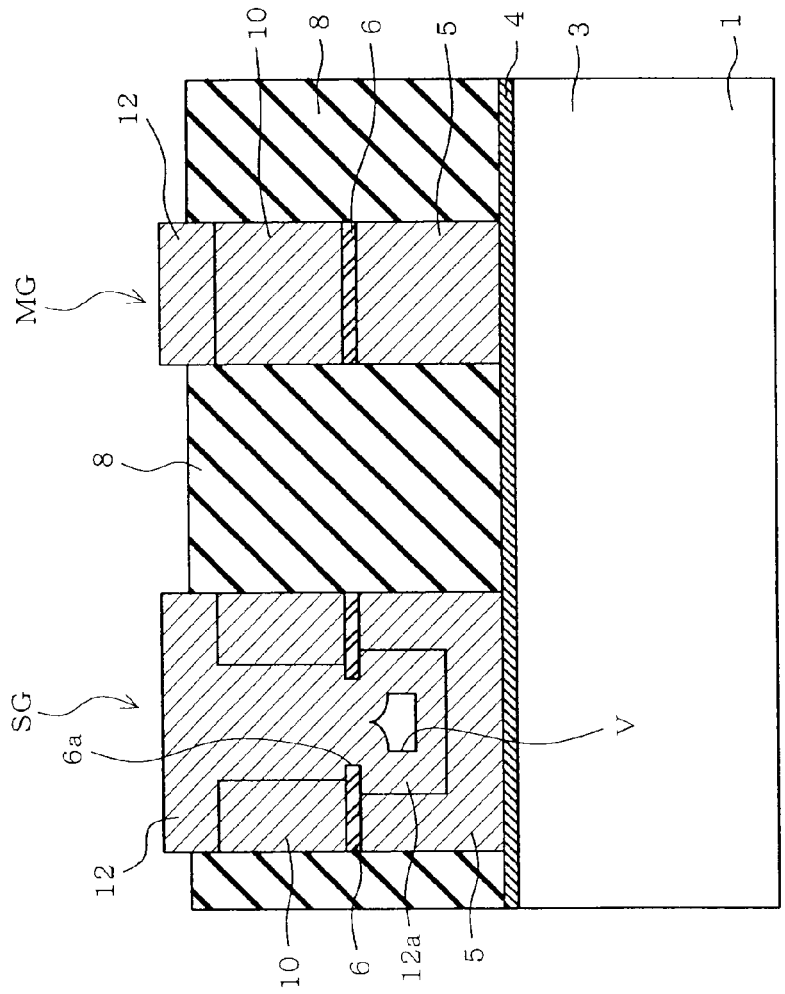
FIG. 16A
FIG. 16B

NONVOLATILE SEMICONDUCTOR MEMORY DEVICE AND METHOD OF FABRICATING THE SAME

CROSS-REFERENCE TO RELATED APPLICATIONS

This application is based on and claims the benefit of priority from the prior Japanese Patent Application No. 2008-244107, filed on Sep. 24, 2008, the entire contents of which are incorporated herein by reference.

BACKGROUND

1. Field

The present invention relates to a nonvolatile semiconductor memory device in which data write and erase are electrically executed and which has a stacked gate structure, and a method of fabricating the same.

2. Related Art

Nonvolatile semiconductor memory devices such as NAND flash memory devices employ the following configuration. An interelectrode insulating film is provided between a floating gate electrode and a control gate electrode in a film configuration of gate electrodes of memory cell transistors. Transistors other than the memory cell transistors employ the same film configuration as of the memory cell transistors but necessitate no floating gate electrode nor interelectrode insulating films. Accordingly, an opening is formed in the interelectrode insulating film, and the control gate electrode and the floating gate electrode are brought into contact with each other through the opening, whereby a short circuit is caused therebetween.

With progress in the refinement of a pattern defined by a design rule, the width of a word line connecting control gate electrodes of memory cell transistors has been reduced, and an interconnection resistance is increased. Consequently, the forming of a metal silicide film having a lower resistance value has been proposed. Even when a metal silicide film is used, it is suggested that silicide should be made as an alloy of a metal such as nickel (Ni) and polycrystalline silicon for the purpose of realizing low resistance.

However, it is difficult to control progress of silicidation when the siliciding process is carried out after gate electrodes have been formed by stacking films. For example, a memory cell transistor includes a portion which suppresses the progress of silicide reaction. In this case, accordingly, no problem arises regarding as an element characteristic even when the silicide reaction reaches the interelectrode insulating film. However, since an opening is formed in the interelectrode insulating film in transistors other than the memory cell transistor, the silicide reaction progresses via the opening into a polycrystalline silicon film to serve as an underlying floating gate electrode. Consequently, the silicide reaction is anticipated to reach a gate insulating film according to the circumstances. This would result in adverse effects such as deterioration in the reliability of the gate oxide film or variations in a threshold of selective gate transistor, whereupon element characteristics would be adversely affected.

Japanese patent application publication JP-A-2007-207946 discloses means for overcoming the above-noted problem. In this case, an insulating film serving as a stopper is interposed in the opening to control silicidation. However, the interposition of insulating film results in an increase in electrical resistance in a portion to be normally connected electrically. Thus, problems sill need to be overcome regarding element characteristics.

SUMMARY

According to one aspect of the present invention, there is provided a nonvolatile semiconductor memory device comprising a semiconductor substrate, a gate insulating film formed on the semiconductor substrate, a first gate electrode corresponding to a memory cell transistor, including a floating gate electrode film formed on the gate insulating film, a first interelectrode insulating film formed on the floating gate electrode film and a control gate electrode film formed on the first interelectrode insulating film, the floating gate electrode film having a polycrystalline silicon film and the control gate electrode film having a silicide film, and a second gate electrode including a lower electrode film formed on the gate insulating film, a second interelectrode insulating film formed on the lower electrode film and an upper electrode film formed on the second interelectrode insulating film, wherein the second interelectrode insulating film includes an opening, the lower electrode film includes a void below the opening of the second interelectrode insulating film, the upper electrode film includes a silicide film, the lower electrode film include a polycrystalline silicon film and a silicide film which is located between the opening and the void.

According to another aspect of the invention, there is provided a method of fabricating a nonvolatile semiconductor device, comprising forming, on an upper surface of a semiconductor substrate, a gate insulating film, a first polycrystalline silicon film added with an impurity and a first processing insulating film sequentially; processing the first polycrystalline silicon film, the gate insulating film and the semiconductor substrate with the first processing insulating film serving as a mask, thereby forming an element isolation trench, and forming an element isolation insulating film in the element isolation trench and dividing the element isolation insulating film into a plurality of element forming regions on a surface of the semiconductor substrate; removing the first processing insulating film and etching back the element isolation insulating film so that a predetermined height is reached; forming, on upper surfaces of the first polycrystalline silicon film and the element isolation insulating film, an interelectrode insulating film, a second polycrystalline silicon film having a lower impurity concentration than the first polycrystalline silicon film and a second processing insulating film; forming a trench extending through the second processing insulating film, the second polycrystalline silicon film, the interelectrode insulating film and reaching an upper portion of the first polycrystalline silicon film so that the trench has a predetermined depth, and forming a short-circuit opening having a first width in the interelectrode insulating film; removing a part of a sidewall of the second polycrystalline silicon film facing the trench so that a part of the trench facing the polycrystalline silicon film has a second width which is larger than the first width, and removing a part of a sidewall of the first polycrystalline silicon film facing an interior of the trench so that a part of the trench facing the polycrystalline silicon film has a third width larger than the second width; forming a third polycrystalline silicon film on an upper surface of the second polycrystalline silicon film so that a void is formed in a lower portion of the short-circuit opening while the open trench is filled, and forming a third processing insulating film on the third polycrystalline silicon film; etching the third polycrystalline silicon film, the second polycrystalline silicon film, the interelectrode insulating film and the first polycrystalline silicon film with the third processing insulating film serving as a mask, thereby forming a first gate electrode corresponding to a memory cell transistor and a first gate electrode and other transistors corresponding to the other transistors; forming an interlayer insulating film between the first and second gate electrodes, and removing the third processing insulating film, thereby exposing upper surfaces of the third polycrystalline silicon film of the first and second gate electrodes; and forming a siliciding film on an upper surface of the third polycrystalline silicon film and executing a silicidation process so that the second and third polycrystalline silicon films of the first gate electrode are silicided and so that a part of the first polycrystalline silicon film located below the short-circuit opening by way of the second and third polycrystalline silicon films of the second gate electrode and the short-circuit opening.

According to further another aspect of the invention, there is provided a method of fabricating a nonvolatile semiconductor memory device, comprising forming, on an upper surface of a semiconductor substrate, a gate insulating film, a first polycrystalline silicon film added with an impurity and a first processing insulating film sequentially; processing the first polycrystalline silicon film, the gate insulating film and the semiconductor substrate with the first processing insulating film serving as a mask, thereby forming an element isolation trench, and forming an element isolation insulating film in the element isolation trench and dividing the element isolation insulating film into a plurality of element forming regions on a surface of the semiconductor substrate; removing the first processing insulating film and etching back the element isolation insulating film so that a predetermined height is reached; forming, on upper surfaces of the first polycrystalline silicon film and the element isolation insulating film, an interelectrode insulating film, a second polycrystalline silicon film and a second processing insulating film; forming an open trench extending through the second processing insulating film, the interelectrode insulating film and an upper portion of the first polycrystalline silicon film, the open trench having an inclined surface, the open trench having a width that is increased at a bottom side, thereby forming a short-circuit opening having a first width in the interelectrode insulating film; forming an interlayer insulating film between the first and second gate electrodes, and removing the third processing insulating film, thereby exposing an upper surface of the third polycrystalline silicon film of the first and second gate electrodes; and forming a siliciding film on an upper surface of the third polycrystalline silicon film and executing a silicidation process so that the second and third polycrystalline silicon films of the first gate electrode are silicided and so that a part of the first polycrystalline silicon film located below the short-circuit opening by way of the second and third polycrystalline silicon films of the second gate electrode and the short-circuit opening.

BRIEF DESCRIPTION OF THE DRAWINGS

FIGS. 3A and 3B are schematic sectional views taken along cutting-plane lines 3A-3A and 3B-3B in FIG. 2 respectively;

FIGS. 4A and 4B to 16A and 16B are schematic sectional views of the structure at sequential stages of the fabrication process corresponding to the cut portions in FIGS. 3A and 3B respectively;

DETAILED DESCRIPTION

Figure 1:
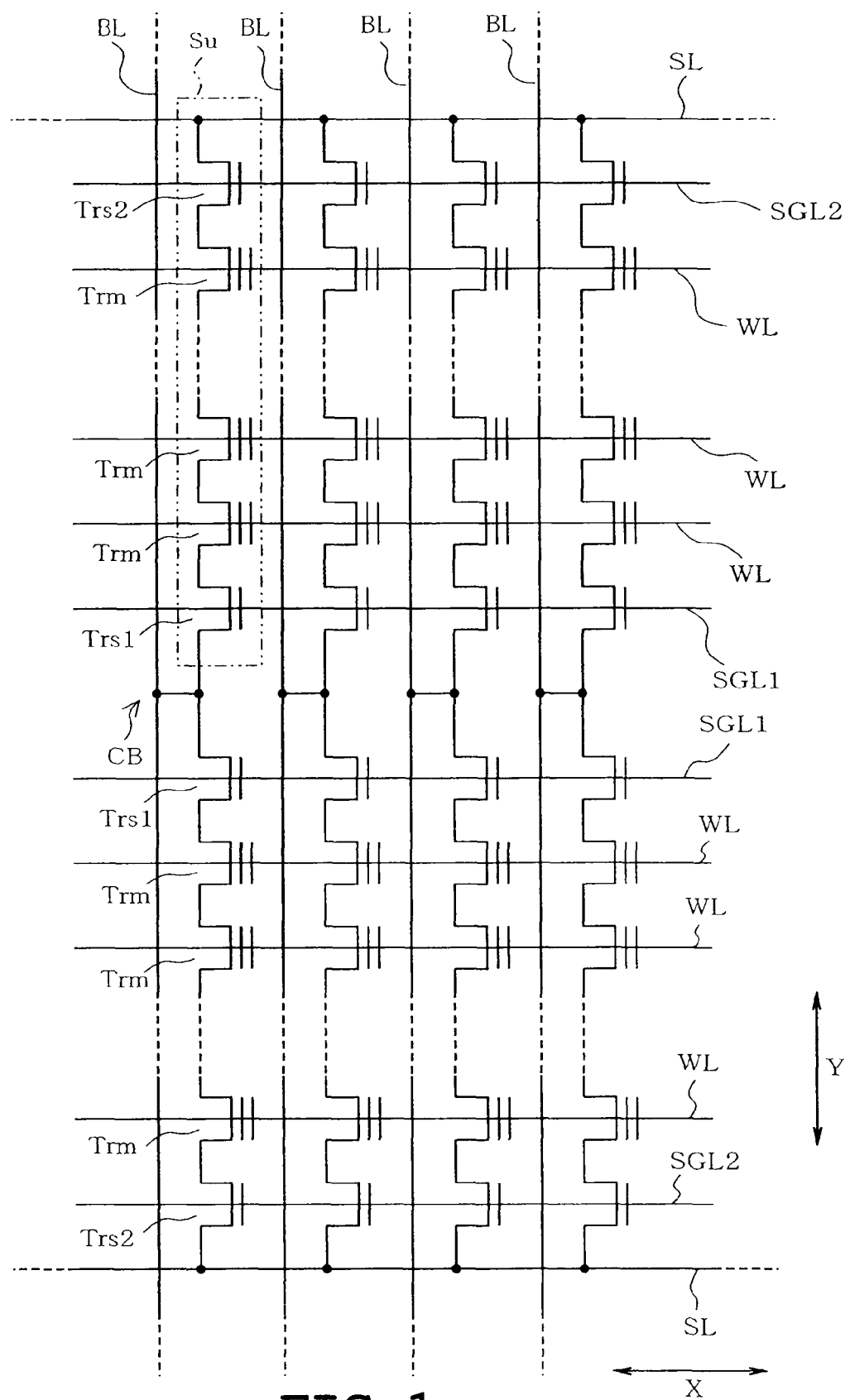
FIG. 1 is a schematic diagram of an electrical arrangement of a part of memory cell region of a flash memory device of an embodiment in accordance with the present invention.

A first embodiment will be described with reference to the accompanying drawings. The embodiment is directed to a NAND flash memory device provided with a stacked gate structure. Identical or similar parts are labeled by the same reference numerals in the following description. The drawings typically illustrate the embodiment, and the relationship between a thickness and planar dimension, layer thickness ratio and the like differ from respective natural dimensions.

FIG. 1 is an equivalent circuit diagram showing part of a memory cell allay formed in a memory cell region of the NAND flash memory device. Firstly, the memory cell array in a memory cell region includes a plurality of NAND cell units Su arranged into a matrix. Each NAND cell unit Su comprises two selective gate transistors Trs1 and Trs2 and a plurality of (8 ($2^n$ where n is a positive integer number), for example) memory cell transistors Trm series-connected between the selective gate transistors Trs1 and Trs2. The adjacent memory cell transistors Trm share a source/drain region.

The memory cell transistors Trm in each row of the matrix are aligned in the X direction (corresponding to the direction of word line and a second direction) in FIG. 1 and common-connected to a word line WL. The selective gate transistors Trs1 in each row of the matrix are aligned in the X direction in FIG. 1 and common-connected to a selective gate line SGL1. The selective gate transistors Trs2 in each row of the matrix are also aligned in the X direction in FIG. 1 and common-connected to a selective gate line SGL2. Bit line contacts CB are connected to drain regions of the selective gate transistors Trs1 respectively. The bit line contacts CB are also connected to bit lines BL in the Y direction (corresponding to the direction of gate length and a first direction) perpendicular to the X direction in FIG. 1. The selective gate transistors Trs2 in each row are connected via source regions to a source line SL extending in the X direction in FIG. 1.

Figure 2:
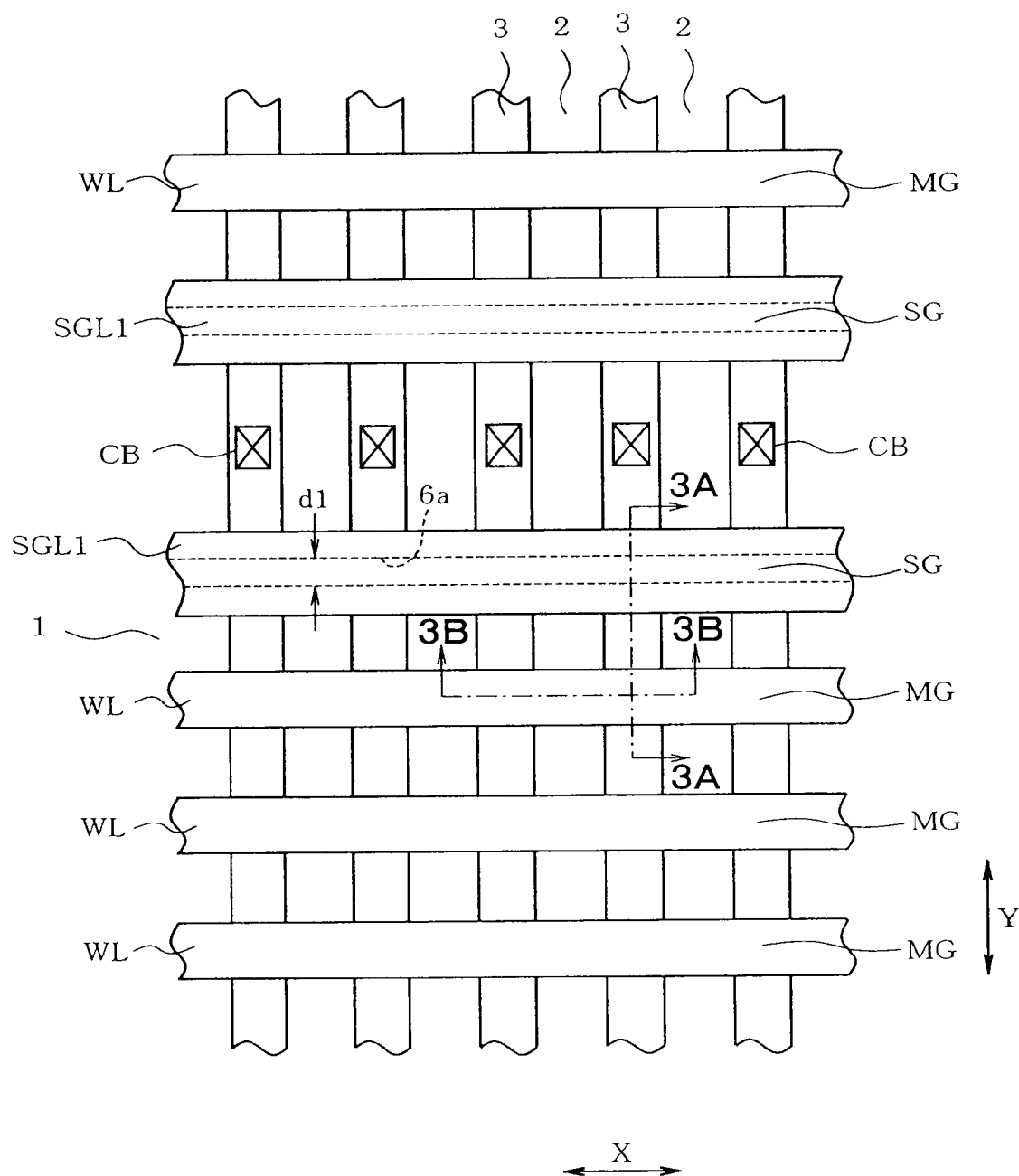
FIG. 2 is a schematic plan view of the part of the memory cell region.

FIG. 2 shows the layout pattern of a part of memory cell region. A plurality of element isolation insulating films 2 are formed so as to extend in the Y direction in a surface layer of a silicon substrate 1 serving as a semiconductor substrate as shown in FIG. 2. The element isolation insulating films 2 are formed by a shallow trench isolation (STI) process so as to be spaced from one another in the X direction in FIG. 2. The surface layer of the silicon substrate 1 is divided by the element isolation insulating films 2 into a plurality of active regions (element formation regions) 3. The word lines WL of the memory cell transistors Trm are formed so as to extend in the X direction perpendicular to the active regions 3.

A pair of selective gate lines SGL1 are formed so as to extend in the X direction in FIG. 2. The bit line contacts CB are formed in respective portions of the active regions 3 located between the paired selective gate lines SGL1. The memory cell transistors Trm have gate electrodes MG formed on portions of the active regions 3 intersecting the word lines WL respectively. The selective gate transistors Trs1 have gate electrodes SG formed on portions of the active regions 3 intersecting the selective gate lines SGL1 respectively.

FIG. 3A shows a section of the structure taken along the direction in which the active region 3 of the memory cell transistor Trm is formed in the memory cell region (in the Y direction in FIG. 2). FIG. 3B shows another section of the structure taken along the direction in which the word lines WL of the memory cell transistors are formed. FIGS. 3A and 3B schematically illustrate the structure subsequent to execution of a siliciding treatment constituting a stage of the fabrication process.

In FIG. 3A, a surface layer of the silicon substrate 1 is provided with a plurality of active regions 3 which are the element formation regions formed by dividing the element isolation insulating film 2 as described above. A gate insulating film 4 is formed on an upper surface of the active region 3. On the gate insulating film 4 are in turn formed a plurality of gate electrodes MG of the memory cell transistor serving as first gate electrodes and a plurality of gate electrodes SG of the selective gate transistor serving as second gate electrodes. The gate electrodes MG and SG are formed at respective predetermined intervals. A gate electrode of a transistor formed in a peripheral circuit region also serves as the second gate electrode although not shown.

Each gate electrode MG is formed by stacking a floating gate electrode film 5A, a first interelectrode insulating film 6 and a control gate electrode film 7A sequentially from the bottom. The floating gate electrode film 5A is formed from a polycrystalline silicon film. The first interelectrode insulating film 6 is formed from an oxide-nitride-oxide (ONO) film, for example. The control gate electrode film 7A is formed from two layers of silicide films 7a and 7b obtained by siliciding a polycrystalline silicon film with the use of a metal.

Each gate electrode SG is also formed by stacking a floating gate electrode film 5B serving as a lower-layer electrode film, a second interelectrode insulating film 6 and a control gate electrode film 7B serving as an upper-layer electrode film sequentially from the bottom. The interelectrode insulating film 6 is also formed from an oxide-nitride-oxide (ONO) film and has a central short-circuit opening 6a extending in the direction of word lines WL. The short-circuit opening 6a is provided for electrically short-circuiting the floating gate electrode film 5B and the control gate electrode film 7B.

The floating gate electrode film 5B is also formed from a polycrystalline silicon film 5a and includes a part located below the short-circuit opening 6a of the second interelectrode insulating film 6. The part of the floating gate electrode film 5B is formed from a different polycrystalline silicon film 5b and has such a depth as to be larger than a width of the short-circuit opening 6a and as not to reach the gate insulating film 4. The part of the floating gate electrode film 5B has a centrally located void V with a ceiling, a sidewall and a bottom. The void V is to be formed in a film forming process. Regions extending downward from the short-circuit opening 6a and located at both sides of the void V are formed as a silicide film 7c.

The control gate electrode film 7B is composed of two layers of silicide films 7a and 7b obtained by siliciding a polycrystalline silicon film with the use of a metal. The lower layer silicide film 7a is divided into two parts by a central part thereof having a width d2 slightly larger than a width d1 of the short-circuit opening 6a of the interelectrode insulating film 6 (see FIG. 11A). The upper layer side silicide film 7b is formed so as to fill a space between the divided parts and further so as to be connected via the short-circuit opening 6a to the lower layer side silicide film 7c of the floating gate electrode film 5A.

An interlayer insulating film 8 comprising a silicon oxide film is formed between the gate electrodes MG and SG. In the state as shown in FIG. 3A, the interlayer insulating film 8 is formed so as to have such a height that upper portions of the silicide films 7a of the gate electrodes MG and SG protrude exceeding the interlayer insulating film 8 in the middle of the processing. Although an impurity diffusion region to be formed into a source/drain region is adapted to be formed in the surface layer of the silicon substrate 1, the impurity diffusion region is eliminated in FIG. 3A in the foregoing description of the device configuration.

According to the above-described configuration, the entire control gate electrode film 7A of the gate electrode MG is formed as the silicide films 7a and 7b. Consequently, the word lines WL can be configured to have a low resistance. Furthermore, the control gate electrode film 7B of the gate electrode SG is composed of the silicide films 7a and 7b and formed so as to be electrically connected via the short-circuit opening 6a to the silicide film 7c near the void V of the floating gate electrode film 5B. Consequently, the silicide film 7c can be configured not to protrude lower than both sides with the use of the void V.

Referring now to FIG. 3B, the silicon substrate 1 includes the surface layer formed with a plurality of trenches which are filled with the element isolation insulating films 2 comprising the silicon oxide films respectively. The STI structure is configured by the element isolation insulating films 2, whereupon the aforesaid active regions 3 are formed. The gate insulating film 4 is formed on an upper surface of each active region 3. The floating gate electrode film 5A is formed on the upper surface of each gate insulating film 4. The interelectrode insulating film 6 is formed on the upper surface and sides of each floating gate electrode film 5A and the upper surface of each element isolation insulating film 2. The control gate electrode film 7A including the silicide films 7a and 7b are formed on the upper surface of the interelectrode insulating film 6. The foregoing describes the configuration of the structure in the middle stage of the fabrication process. Actually, however, a wafer fabrication process thereafter ends through a contact forming stage, an interlayer wiring process and the like. An obtained wafer is cut into chips, whereupon a NAND flash memory device is fabricated.

Figure 4A:
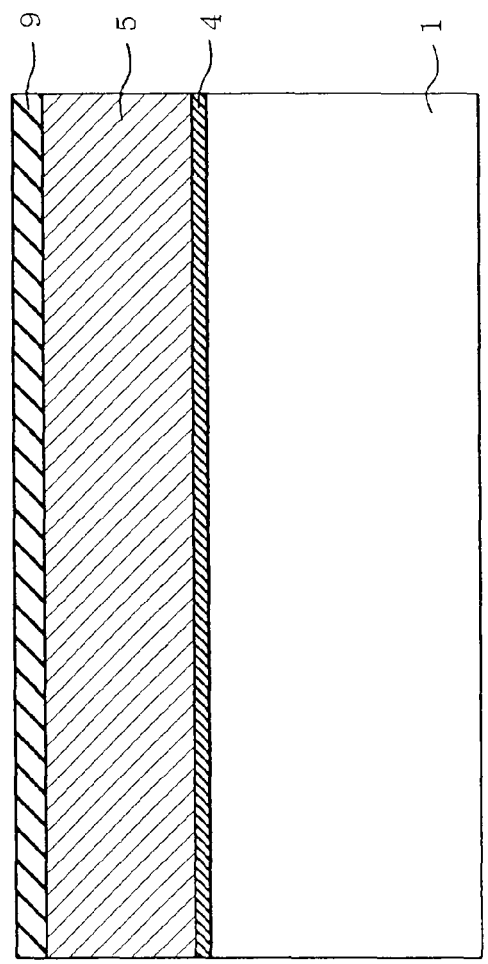
Figure 4B:
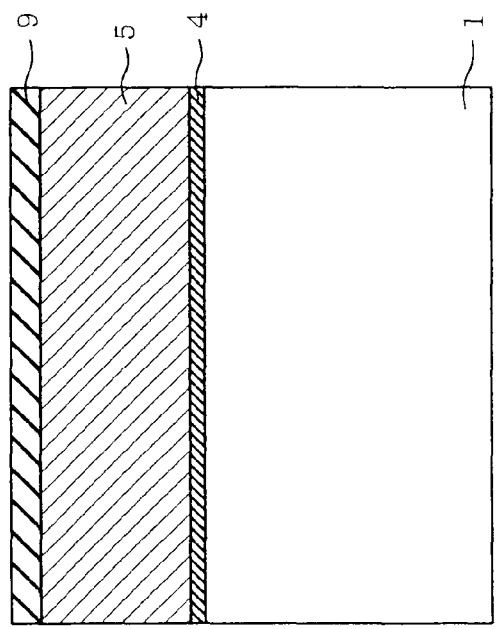

The fabrication process for the above-described configuration will now be described with reference to FIGS. 4A to 18B as well as FIGS. 1 to 3B. FIGS. 4A and 4B to 18A and 18B show the same configurations as those of FIGS. 3A and 3B respectively. Firstly, the gate insulating film 4 with a predetermined film thickness is formed on the upper surface of the silicon substrate 1 by a thermal oxidation technique as shown in FIGS. 4A and 4B. The polycrystalline silicon film 5 with a predetermined film thickness is formed by a low-pressure chemical vapor deposition (CVD) method. Phosphorus (P) serving as an impurity is added to the polycrystalline silicon film 5. The polycrystalline silicon film 5 is processed into the floating gate electrode films 5A and 5B. The silicon nitride film 9 with a predetermined film thickness is also formed on an upper surface of the polycrystalline silicon film 5 by the low-pressure CVD method. The silicon nitride film 9 serves as a first processing insulating film.

Figure 5B:
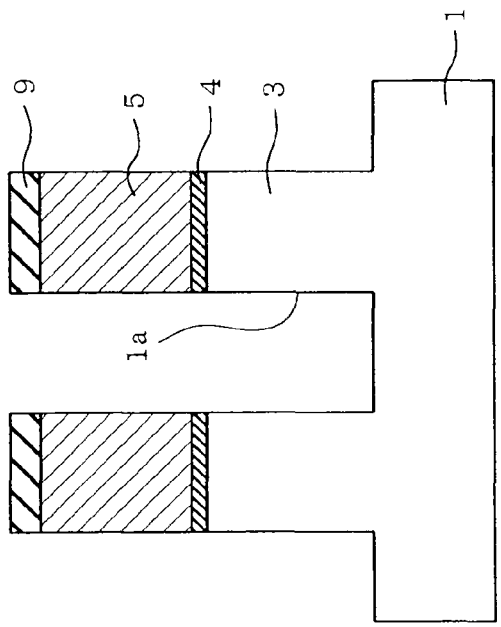
Figure 5A:
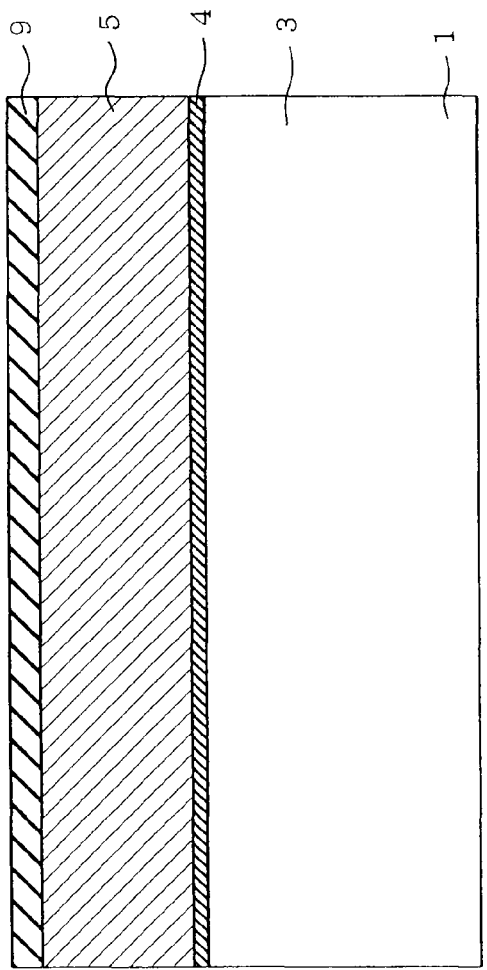

Subsequently, the trench 1a is formed in the silicon substrate 1 as shown in FIGS. 5A and 5B. A photoresist (not shown) is processed into a desired pattern by a lithography technique. The silicon nitride film 9, the polycrystalline silicon film 5, the gate insulating film 4 and the silicon substrate 1 are etched by a reactive ion etching (RIE) method with the photoresist serving as a mask, so that the trench 1a as shown in FIG. 5B is formed. The photoresist is then removed by the ashing technique, and the surface layer of the silicon substrate 1 is divided into the element formation regions, namely, the active regions 3 as shown in FIG. 5B.

Figure 6B:
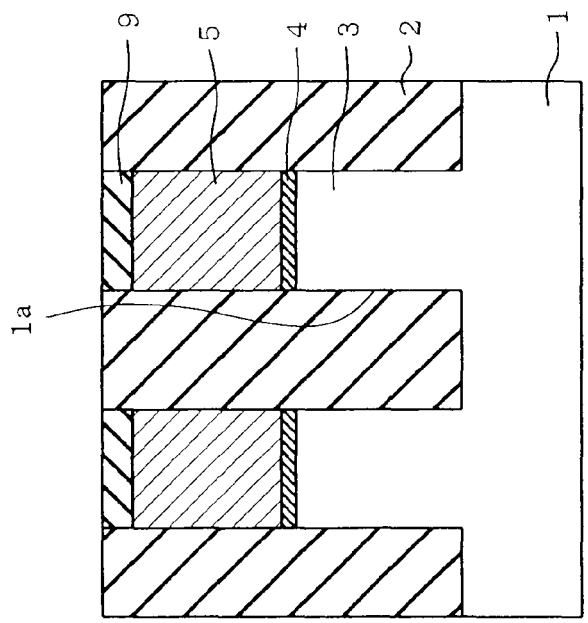
Figure 6A:
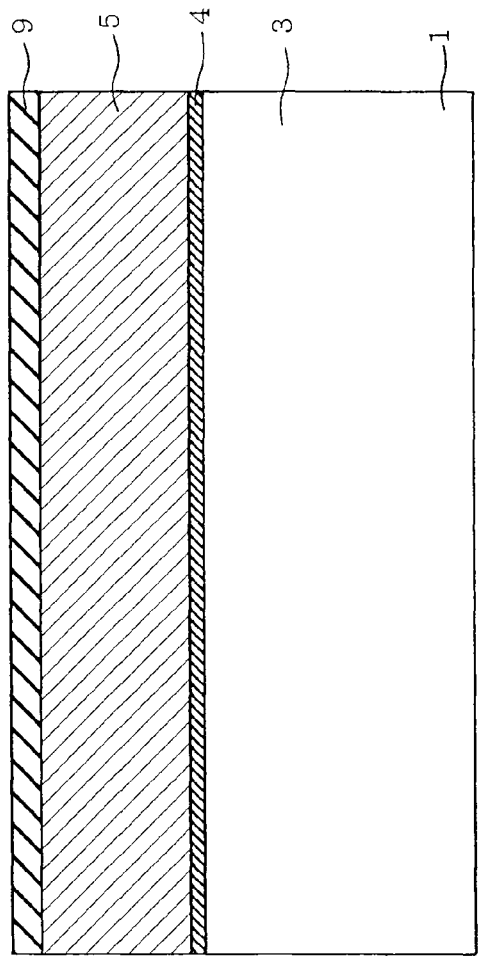

Subsequently, the element isolation insulating film 2 is formed as shown in FIGS. 6A and 6B. A thermal treatment is carried out in an oxygen atmosphere so that a thin thermal oxidation film is formed on inner walls of the trenches 1a, as shown in FIGS. 6A and 6B. Thereafter, the silicon oxide film serving as the element isolation insulating film 2 or the like is deposited by a high density plasma (HDP) method so as to fill the trenches 1a. The structure is polished by a chemical mechanical polishing (CMP) method with the silicon nitride film 9 serving as a stopper. As a result, part of the element isolation insulating film 2 formed above the upper surface of the silicon nitride film 9 is removed, whereupon only the trenches 1a are filled with the element isolation insulating film 2 and are then planarized into the configuration as shown in FIG. 6B.

Figure 7B:
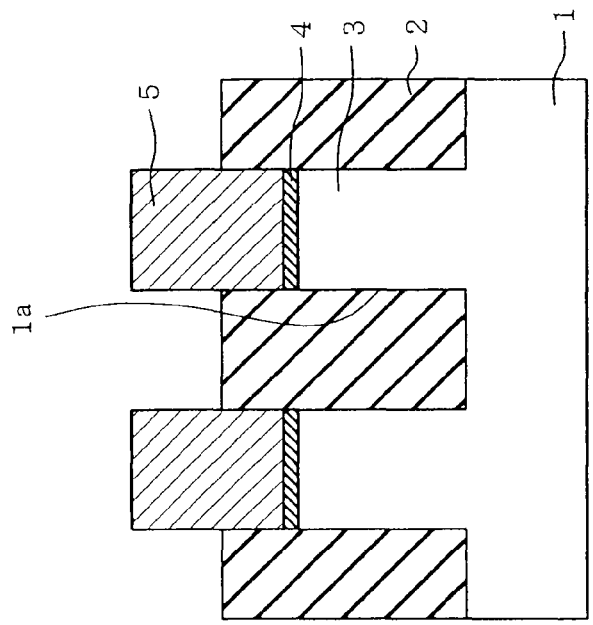
Figure 7A:
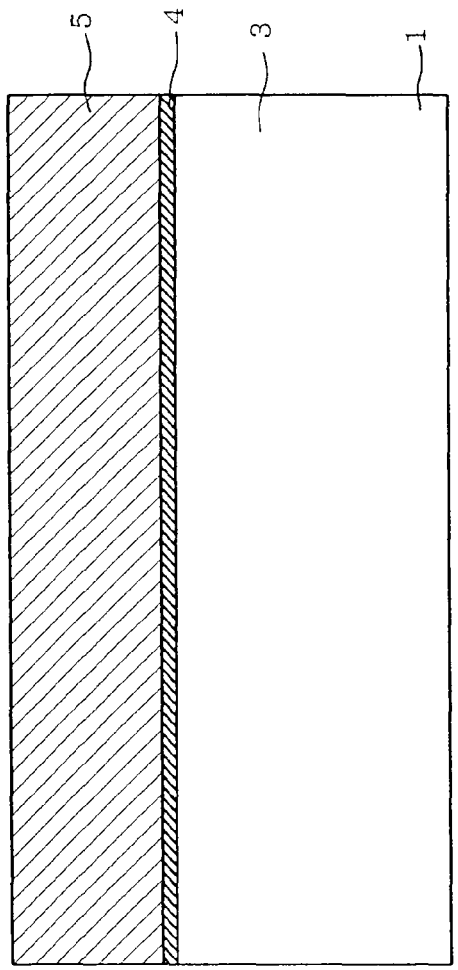

Subsequently, the element isolation insulating film 2 is processed so that the height thereof is reduced as shown in FIGS. 7A and 7B, and thereafter, the processing silicon nitride film 9 is removed. In this case, the element isolation insulating film 2 is etched under the condition where the silicon oxide film is etched by the RIE method, so that the height thereof is reduced so as to correspond to the middle of the side of the polycrystalline silicon film 5. Furthermore, the silicon nitride film 9 is etched by a wet treatment or the like thereby to be removed. The upper surface of the element isolation insulating film 3 is lowered in order that a contact area may be increased between the polycrystalline silicon film 5 to be formed into the floating gate electrode film and the interelectrode insulating film 6.

Subsequently, the interelectrode insulating film 6, the polycrystalline silicon film 10 to be formed into the control gate electrode films 8A and 8B, and the silicon oxide film 11 are sequentially stacked on the upper surfaces of the element isolation insulating films 2 and the upper surfaces and the sides of the polycrystalline silicon films 5. The interelectrode insulating film 6 is formed by depositing a material such as an ONO film, a nitride-oxide-nitride-oxide-nitride (NONON) film or a high dielectric film (high-k) by the low-pressure CVD method. The polycrystalline silicon film 10 is also formed by the low-pressure CVD method so as to have a film thickness of about 40 nm and so as to be added with no impurities.

Figures 9A, 9B:
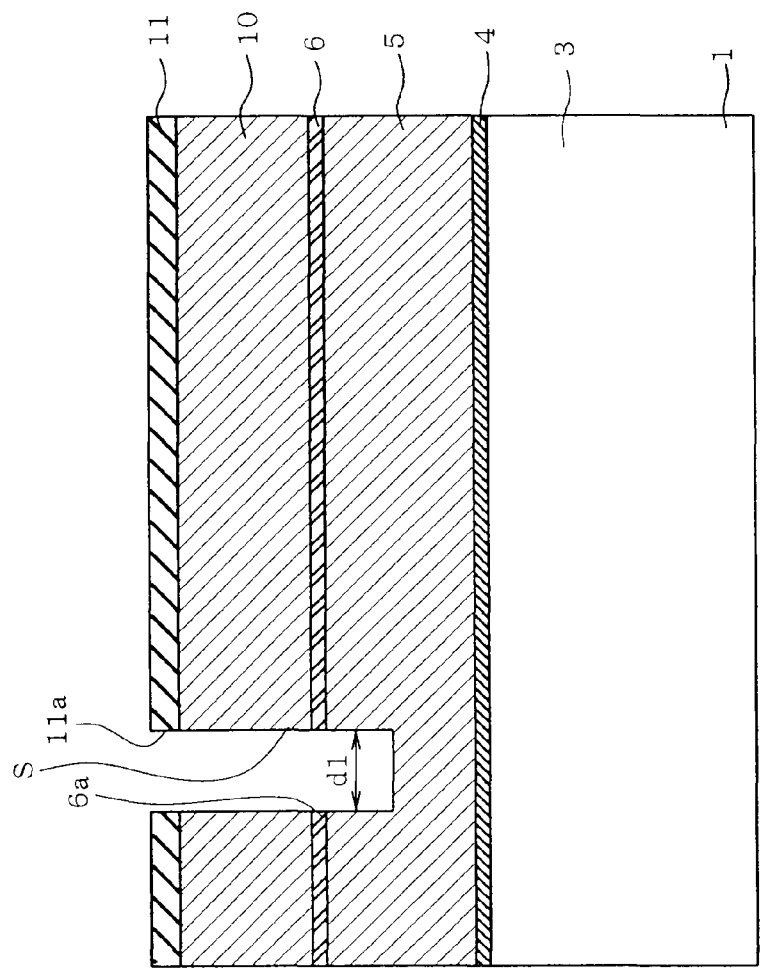

Subsequently, a trench S is formed at the gate electrode SG side as shown in FIGS. 9A and 9B. A photoresist is patterned by the lithography treatment so as to correspond to a location of the slit-like short-circuit opening 6a to be formed in the interelectrode insulating film 6. The silicon nitride film 22, the polycrystalline silicon film 10 and the interelectrode insulating film 6 are etched by the RIE method with the photoresist serving as a mask so that a slit-like opening is formed. Furthermore, the polycrystalline silicon film 5 is etched so that a predetermined depth is obtained, whereby the trench S is formed. Thereafter, the photoresist is removed by the ashing treatment, whereby the slit-like short-circuit opening 6a with a width d1 is formed in the interelectrode insulating film 6 as shown in FIG. 2.

Figure 10B:
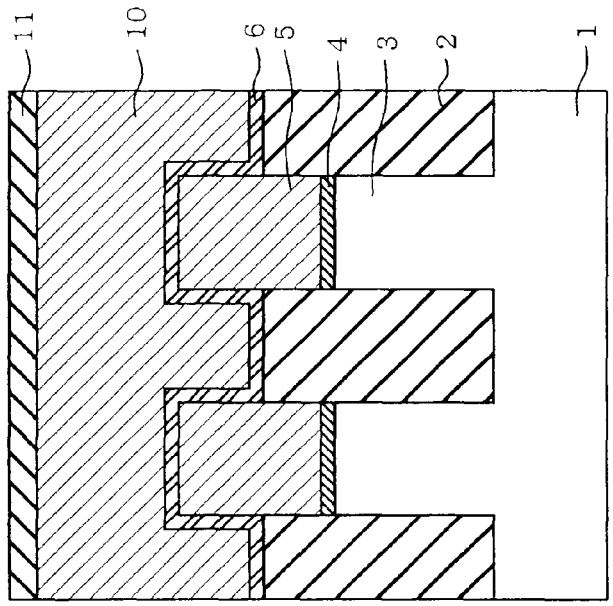
Figure 10A:
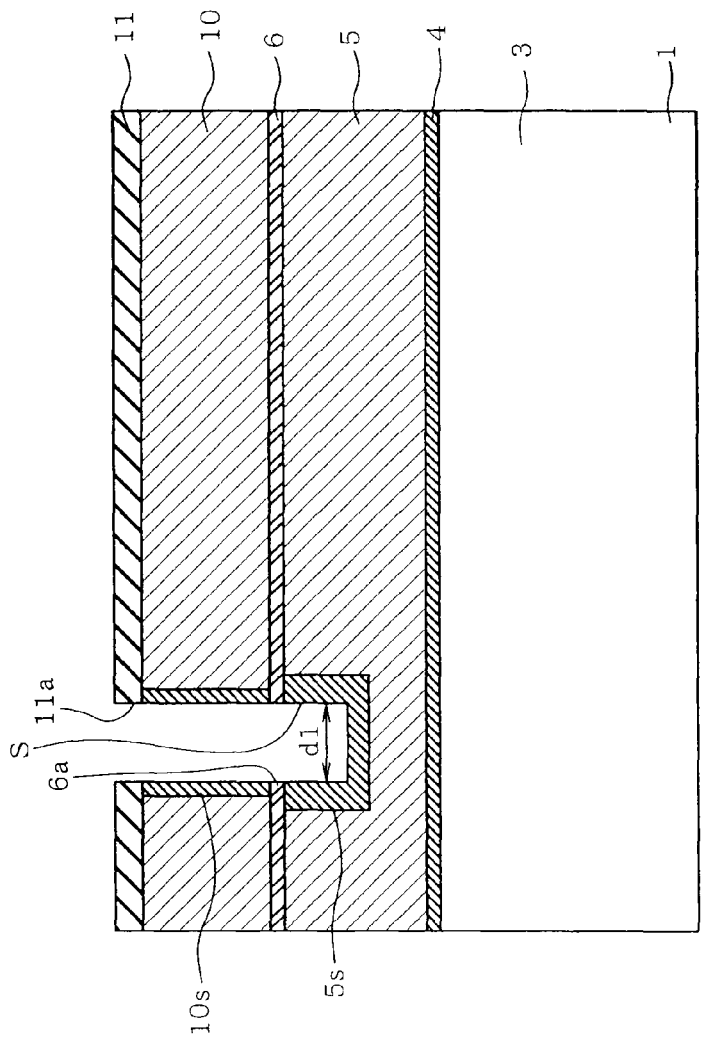

Subsequently, an oxidation treatment is carried out in an oxygen atmosphere to oxidize the polycrystalline silicon films 5 and 10 both exposed at the sides and bottom of the trench S, thereby forming silicon oxide films 5s and 10s respectively, as shown in FIGS. 10A and 10B. In this case, since the polycrystalline silicon film 5 is added with phosphorus P as impurity, oxidation progresses faster in the polycrystalline silicon film 5 than in the polycrystalline silicon film 10. As a result, the silicon oxide film 5s has a larger film thickness than the silicon oxide film 10s. The difference in the oxidation rate depends upon impurity density. The oxidation progresses faster as the density is increased. Accordingly, even when the impurity has been added to the silicon oxide film 10 and the impurity density of the silicon oxide film 10 is lower than that of the polycrystalline silicon film 5, the film thickness of the silicon oxide film 5s to be formed has a larger film thickness than the silicon oxide film 10s.

Figure 11B:
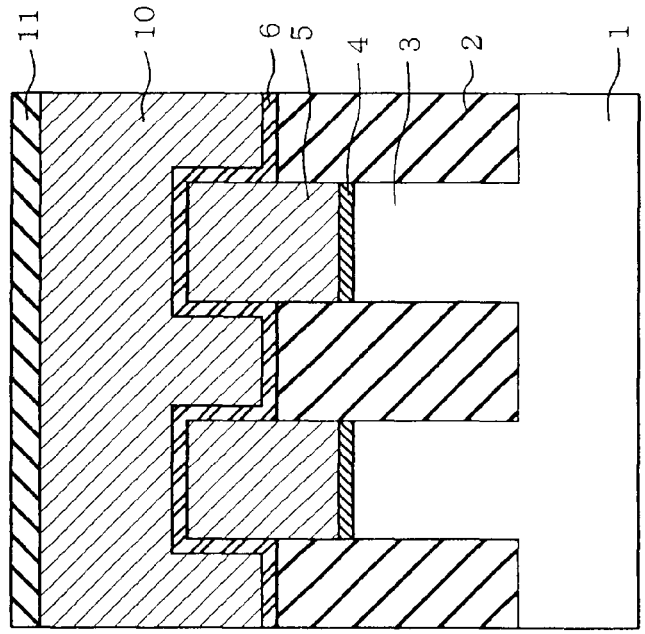
Figure 11A:
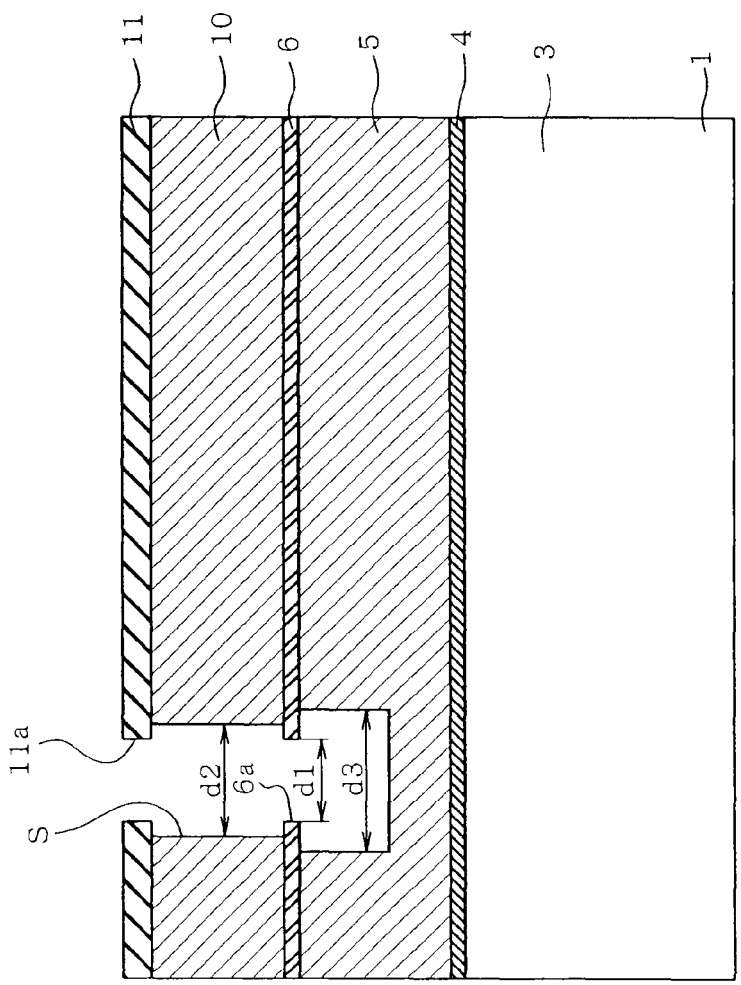

Subsequently, a trench forming process is carried out so that the silicon oxide films 5a and 10s both formed at the above-described processing step are removed, as shown in FIGS. 11A and 11B. In the trench forming process, a wet etching treatment with the use of chemical is executed as a method of removing the silicon oxide films 5a and 10s, so that the polycrystalline silicon films 5 and 10 are exposed in the trench S. Consequently, each of the opening 11a of the silicon nitride film 9 and the short-circuit opening 6a of the interelectrode insulating film 6 has a width d1 in the trench S. The trench S includes a part of the polycrystalline silicon film 10 having a width d2 that is larger than the width d1. The trench S further includes a part of the polycrystalline silicon film 5 having a width d3 that is larger than the width d2. Thus, the trench S is formed so as to have a larger lower interior.

Figures 12A, 12B:
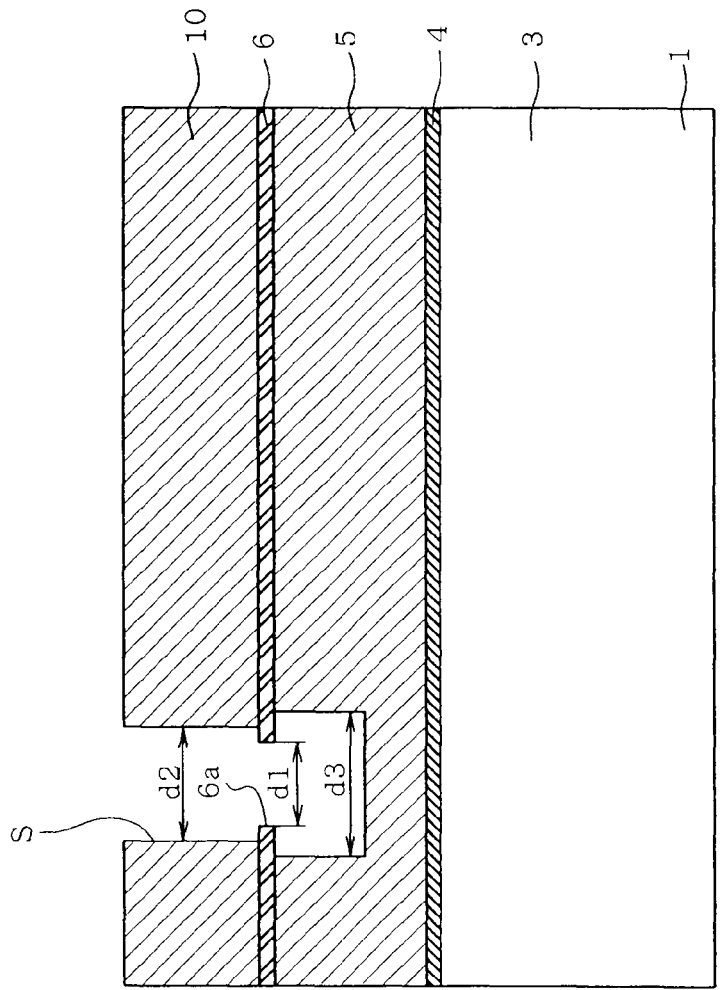

Subsequently, the silicon nitride film 11 having used as a hard mask is removed so that a clean surface of the polycrystalline silicon film 10 is exposed for the purpose of forming the control gate electrode films 7A and 7B, as shown in FIGS. 12A and 12B.

Figure 13B:
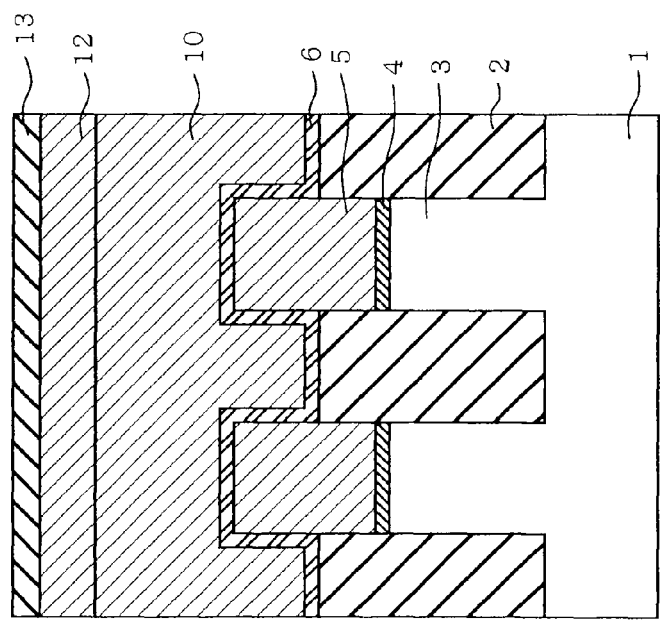
Figure 13A:
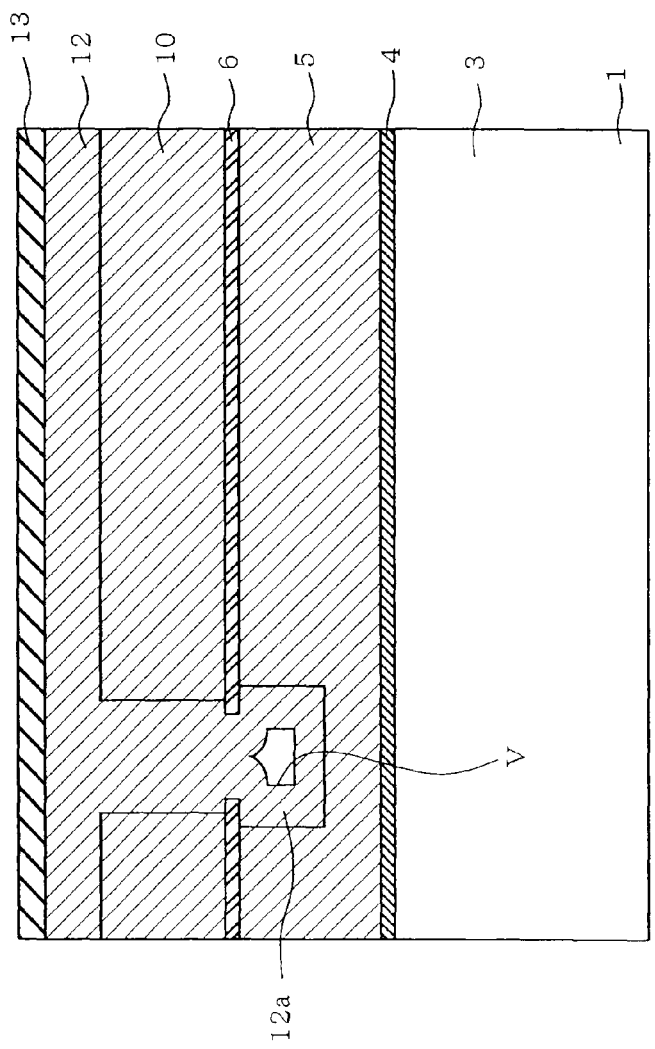

Subsequently, the remaining polycrystalline silicon film 12 serving as the control gate electrode film is stacked on the polycrystalline silicon film 10 as shown in FIGS. 13A and 13B. In this case, since the trench S is formed in the portion corresponding to the gate electrode SG, the polycrystalline silicon film 12 is formed so as to fill the trench S. Furthermore, the lower interior of the trench S is larger than the upper interior as described above. Accordingly, when the forming of the polycrystalline silicon film 12a progresses along an inner surface of the interior part of the polycrystalline silicon film 5 during film forming, the upper interior of the trench S is closed while the lower interior is not completely filled with the polycrystalline silicon film 12 depending upon the shape of the inner surface thereof. As a result, the void V is formed in the lower interior of the trench S. The void V is formed in a region which is to be formed into the floating gate electrode film 5B or more specifically, the void V is formed in a part of the interior of the trench S located below the interelectrode insulating film 6 and in the central interior of the trench S under the short-circuit opening 6a.

Figure 14B:
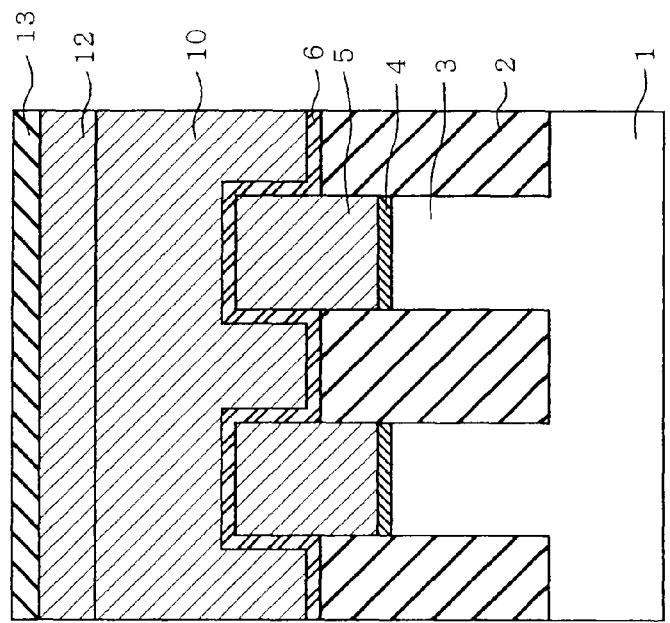
Figure 14A:
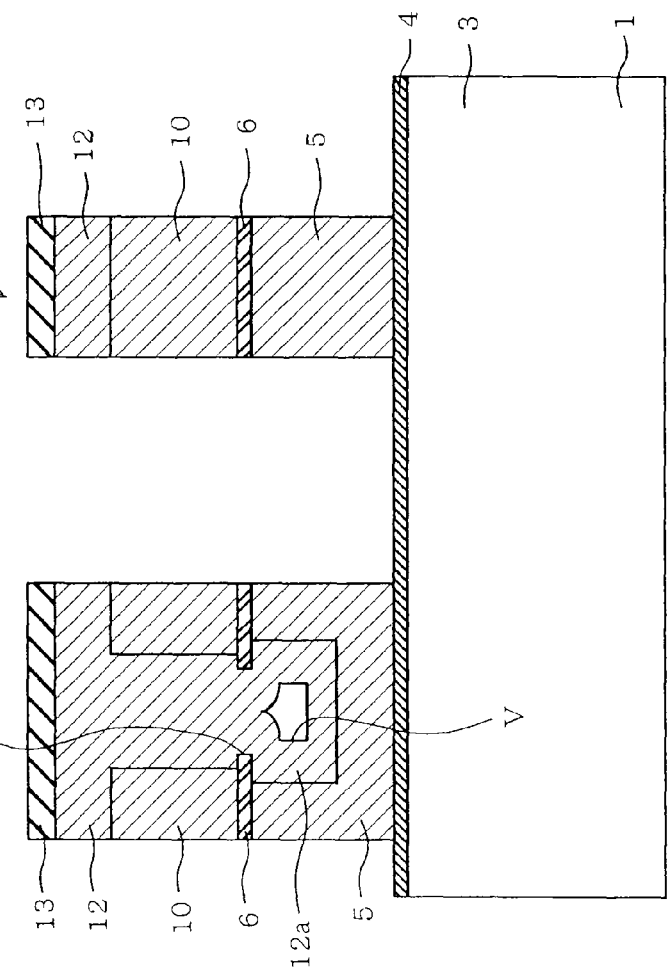

Subsequently, the gate electrodes MG and SG serving as the first and second gate electrodes respectively are formed as shown in FIGS. 14A and 14B. Firstly, photoresist is processed by the lithography process into a pattern of the gate electrodes. The silicon nitride film 13, the polycrystalline silicon films 12, 10 and 5 and the interelectrode insulating film 6 are etched by the RIE method with the photoresist serving as a mask. Thereafter, the photoresist is removed by an ashing technique, and the gate electrodes MG and SG are formed. In this case, the patterning is determined at the gate electrode SG side so that the aforesaid short-circuit opening 6a of the interelectrode insulating film 6 remains in the gate electrode SG.

Subsequently, the interlayer insulating film 8 is deposited so as to fill spaces (not shown) between the gate electrodes MG and SG, MG and MG and SG and SG as shown in FIGS. 15A and 15B. Next, the interlayer insulating film 8 formed on the upper surfaces of the gate electrodes MG and SG are polished thereby to be removed. Subsequently, a silicidation process is carried out so that the control gate electrode films 7A and 7B are formed, as shown in FIGS. 16A and 16B. Firstly, the silicon nitride film 13 is removed in the state as shown in FIGS. 15A and 15B. A part of the upper layer of the interlayer insulating film 8 is removed by an ion etching method such as the RIE method, so that the upper surface and a part of the sides of the polycrystalline silicon film 12 are exposed.

Thereafter, a metal film of cobalt (Co), nickel (Ni), ruthenium (Ru), tungsten (W) or the like is formed by a sputtering method for the purpose of silicidation so as to cover the upper surface of the polycrystalline silicon film 12 as shown in FIGS. 3A and 3B. A thermal treatment for the silicidation is then carried out at a predetermined temperature in a predetermined atmosphere, thereby converting the polycrystalline silicon films 10 and 12 to silicide films. In this case, the silicide reaction ceases when the silicidation of polycrystalline silicon films 10 and 12 progresses in the gate electrode MG thereby to reach the upper surface of the interelectrode insulating film 6. As a result, the polycrystalline silicon films 12 and 10 are converted to silicide films 7b and 7a respectively, whereupon the entire control gate electrode film 7A is formed as the silicide film.

On the other hand, the silicide reaction ceases when the silicidation of polycrystalline silicon films 10 and 12 progresses in the gate electrode SG thereby to reach portions corresponding to the upper surface of the interelectrode insulating film 6. However, the silicide reaction does not cease at a portion of the polycrystalline silicon film 12 corresponding to the short-circuit opening 6a, further progressing downward. A polycrystalline silicon film 12a is formed at the gate electrode film 5B side and the void V is formed inside the polycrystalline silicon film 12a. Accordingly, the progress of the silicide reaction is suppressed at the void V, and the silicide reaction further progresses to a region located at both lateral sides of the void V. As a result, the silicide reaction is retarded at the void V, and a silicide film 7c is formed in the region at both lateral sides of the void V. Consequently, an excessive progress of silicide reaction can be suppressed. When a treating time of silicidation is adjusted, the progress of the silicide reaction can be controlled so that the overall control gate electrode films 7A and 7B are silicided and the silicide reaction is stopped at the void V so as not to reach the gate insulating film 4. Since an adjusting time can be set to a large value, the siliciding treatment can be carried out with improved controllability.

Figure 17B:
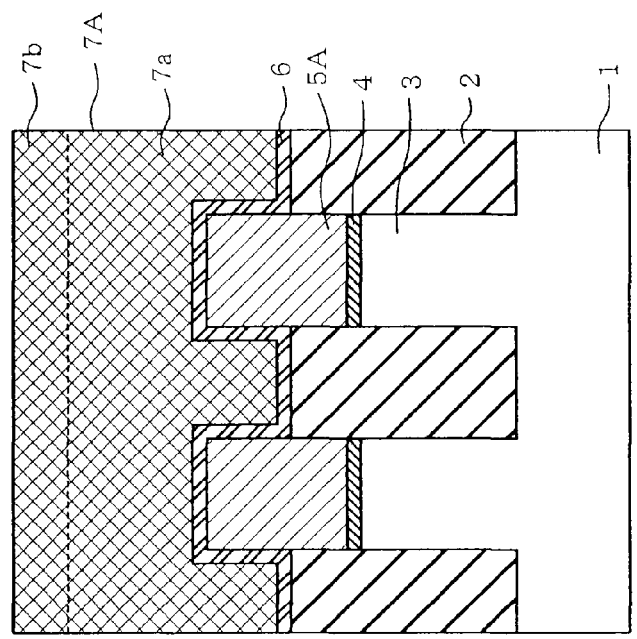
FIGS. 17A and 17B are schematic sectional views of the structure of a first modified form at the stage of the fabrication process corresponding to the cut portions in FIGS. 3A and 3B respectively.
Figure 17A:
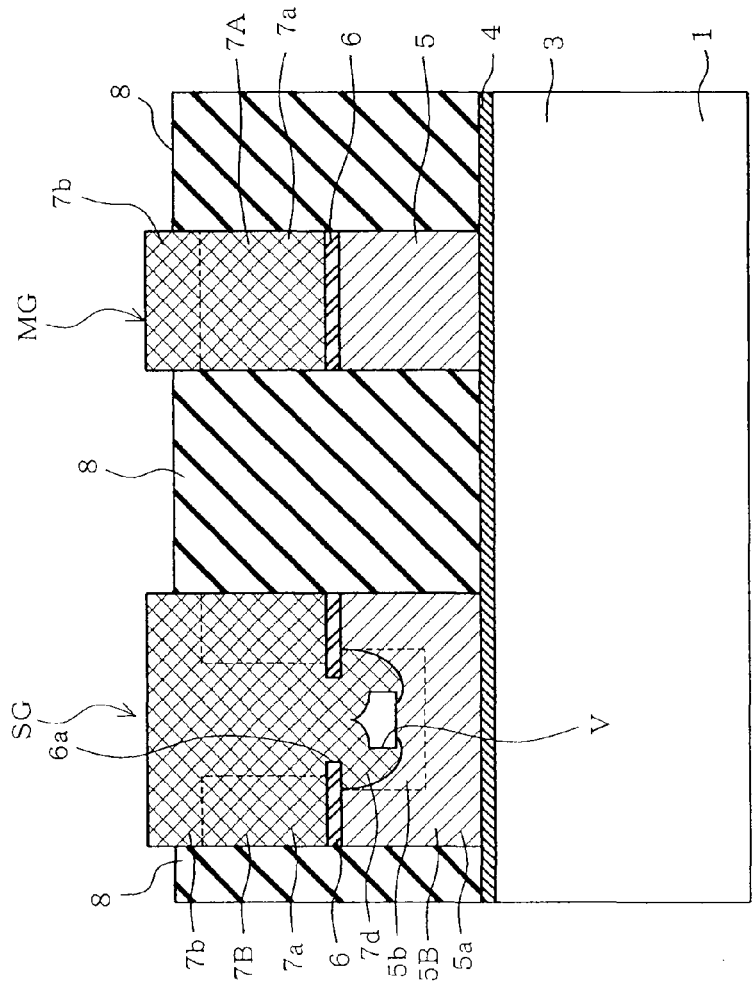

In the above-described case, when the silicide reaction progresses a little longer in addition to the case where the silicide film 7c is formed as shown in FIGS. 3A and 3B, the silicide film 7b is formed so that the silicide reaction covers an entire sidewall of the void V but does not reach the bottom of the void V although the condition is not shown in the drawings. When further progressing, the silicide reaction covers a part of the bottom of the void V such that the silicide film 7d is formed, as shown in FIGS. 17A and 17B.

Figure 18B:
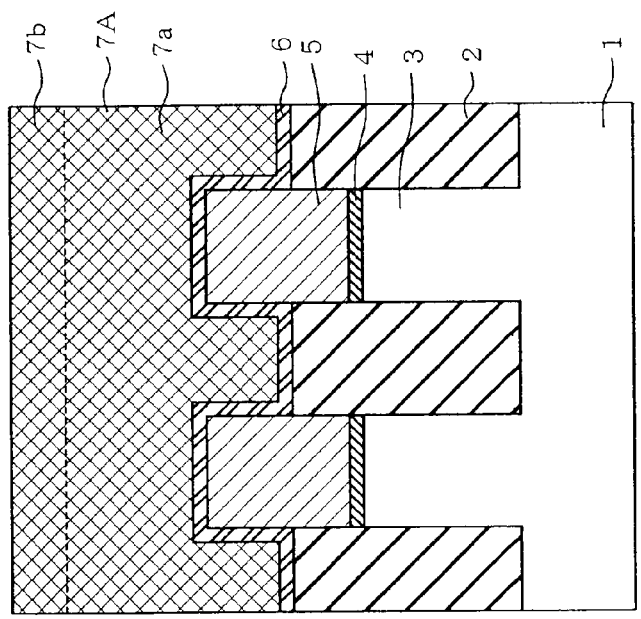
FIGS. 18A and 18B are schematic sectional views of the structure of a second modified form at the stage of the fabrication process corresponding to the cut portions in FIGS. 3A and 3B respectively.
Figure 18A:
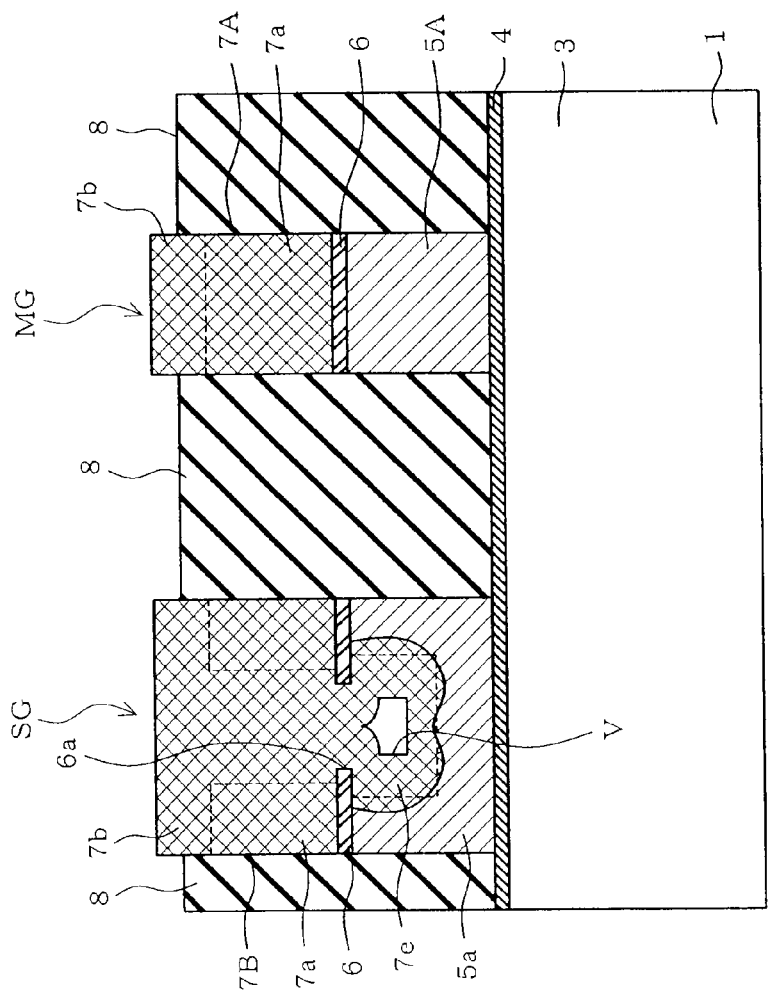

When still further progressing, the silicide reaction covers substantially an entire region below the void V, whereupon a silicide film 7e is formed with the void V remaining inside, as shown in FIGS. 18A and 18B. In this case, too, the progress of the silicide reaction is suppressed such that a high controllable process can be realized.

Thereafter, a wafer fabrication process thereafter ends through a contact forming stage, an interlayer wiring process and the like. An obtained wafer is cut into chips, whereupon a NAND flash memory device is fabricated. Additionally, the foregoing description and drawings eliminate steps of forming impurity diffusion regions to be formed into source/drain regions of the memory cell transistor or the selective gate transistor. Actually, however, the fabrication process includes these steps, which are timely executed.

According to the foregoing embodiment, the short-circuit opening 6a is formed in the interelectrode insulating film 6 regarding the gate electrode SG of the selective gate transistor (or a transistor of the peripheral circuit region) which is a gate electrode other than the gate electrode MG of the memory cell transistor. After execution of the above-described step of forming the short-circuit opening 6a, a large space is defined in the floating gate electrode film 5 when the trench S is filled with the polycrystalline silicon film 12. The space serves to form the void V. The progress of silicide reaction is suppressed at the void V. As a result, the polycrystalline silicon films 12 and 10 of the gate electrodes MG and SG can be converted to the silicide films 7b and 7a respectively. In the case of the gate electrode SG, the void V can improve the controllability in the progress of the silicide reaction which progresses through the short-circuit opening 6a. Consequently, the silicide reaction can be prevented from reaching the gate insulating film 4, whereupon a stable fabrication process can be achieved.

A second embodiment will now be described. The second embodiment eliminates the step of forming the oxide film by thermal treatment is not executed in the forming of the polycrystalline silicon films 5 and 10 in the trench S provided for forming the void V. Since the final configuration of the NAND flash memory device is substantially the same as in the first embodiment, the following describes only the difference between the first and second embodiments.

The surface layers of polycrystalline silicon films 10 and 5 exposed in the trench S are removed by the etching process using the chemical after execution of the step as shown in FIGS. 9A and 9B in the first embodiment, whereby the structure as shown in FIGS. 11A and 11B is obtained. In the etching process using the chemical, either one of the polycrystalline silicon films 10 and 5 with a higher impurity concentration has a higher etching rate than the other. Accordingly, the etching speed is higher in the polycrystalline silicon film 5 added with phosphorus as impurity than the polycrystalline silicon film 10 added with no impurity. As the result of the difference in the etching speed, the etching can be carried out so that the configuration as shown in FIGS. 11A and 11B is obtained. Subsequent steps are executed in the same manner as in the first embodiment, whereupon the same configuration as shown in FIGS. 3A and 3B can be obtained in the second embodiment.

Actually, the etching progresses isotropically in the etching process using the chemical in the state as shown in FIGS. 9A and 9B. Corners of the bottom of the trench S are rather rounded than as shown in FIG. 11A. With this, the bottom of the void V is rounded in the step of filling the trench S with the polycrystalline silicon film 12.

The second embodiment thus configured can achieve the same effect as the first embodiment. Furthermore, the step of thermal treatment can be eliminated when an amount of etching can be controlled properly. Consequently, the number of steps can be reduced.

The foregoing embodiments are not restrictive but may be modified or expanded as follows. The void V is formed in the gate electrode SG of the selective gate transistor in the foregoing embodiments. However, another transistor such as any transistor of a peripheral circuit may be formed with the void V, instead.

Each of the foregoing embodiments employs the difference in the etching speed resulting from the difference in impurity concentration between the polycrystalline silicon films or the difference in the etching speed resulting from the difference in the impurity difference between the polycrystalline silicon films, whereby the space with a large width is formed at the polycrystalline silicon film 5 side. However, the same effect can be achieved by employing the conditions under which an inverted tapered trench is formed may be employed in the etching process in which the trench S is formed, instead.

The foregoing description and drawings are merely illustrative of the principles and are not to be construed in a limiting sense. Various changes and modifications will become apparent to those of ordinary skill in the art. All such changes and modifications are seen to fall within the scope as defined by the appended claims.

What is claimed is:

1. A nonvolatile semiconductor memory device comprising:
    a semiconductor substrate;
    a gate insulating film formed on the semiconductor substrate;
    a first gate electrode corresponding to a memory cell transistor, including a floating gate electrode film formed on the gate insulating film, a first interelectrode insulating film formed on the floating gate electrode film and a control gate electrode film formed on the first interelectrode insulating film, the floating gate electrode film having a polycrystalline silicon film and the control gate electrode film having a silicide film; and
    a second gate electrode including a lower electrode film formed on the gate insulating film, a second interelectrode insulating film formed on the lower electrode film and an upper electrode film formed on the second interelectrode insulating film, wherein:
    the second interelectrode insulating film includes an opening, the lower electrode film includes a void below the opening of the second interelectrode insulating film, the upper electrode film includes a silicide film, the lower electrode film includes a polycrystalline silicon film and a silicide film which is located between the opening and the void.

2. The nonvolatile semiconductor memory device according to claim 1, wherein the silicide film of the lower electrode film is formed so as to surround the void.

3. The nonvolatile semiconductor memory device according to claim 1, wherein the silicide film of the lower electrode film is formed so as to surround a ceiling and a sidewall of the void except a bottom of the void.

4. The nonvolatile semiconductor memory device according to claim 1, wherein the polycrystalline silicon film of the lower electrode film is located between the gate insulating film and the silicide film of the lower electrode film.

5. The nonvolatile semiconductor memory device according to claim 1, wherein the silicide film is made by siliciding any one of metals of cobalt (Co), nickel (Ni), ruthenium (Ru) and tungsten (W).

6. The nonvolatile semiconductor memory device according to claim 1, wherein the first and second interelectrode insulating films comprise an oxide-nitride-oxide (ONO) film, a nitride-oxide-nitride-oxide-nitride (NONON) film or high dielectric (high-k) film.

7. The nonvolatile semiconductor memory device according to claim 1, wherein the second gate electrode is a gate electrode of a selective gate transistor.

8. The nonvolatile semiconductor memory device according to claim 1, wherein the second gate electrode is a gate electrode of a transistor disposed in a peripheral circuit region.

* * * * *